(12) United States Patent
Bharatan et al.

(10) Patent No.: US 9,078,069 B2
(45) Date of Patent: Jul. 7, 2015

(54) MEMS MICROPHONE WITH SPRINGS AND INTERIOR SUPPORT

(75) Inventors: Sushil Bharatan, Burlington, MA (US); Aleksey S. Khenkin, Nashua, NH (US); Thomas D. Chen, Cambridge, MA (US)

(73) Assignee: INVENSENSE, INC., San Jose, CA (US)

( * ) Notice: Subject to any disclaimer, the term of this patent is extended or adjusted under 35 U.S.C. 154(b) by 49 days.

(21) Appl. No.: 13/348,400

(22) Filed: Jan. 11, 2012

(65) Prior Publication Data

US 2013/0177180 A1 Jul. 11, 2013

(51) Int. Cl.
*H04R 1/00* (2006.01)
*H04R 19/04* (2006.01)
*H04R 7/04* (2006.01)
*H04R 7/20* (2006.01)
*H04R 19/00* (2006.01)

(52) U.S. Cl.
CPC .......... *H04R 19/04* (2013.01); *H04R 7/04* (2013.01); *H04R 7/20* (2013.01); *H04R 19/005* (2013.01); *H04R 2201/003* (2013.01); *H04R 2225/49* (2013.01)

(58) Field of Classification Search
USPC .................. 381/174, 175; 257/704, 729, 730; 438/623, 125
See application file for complete search history.

(56) References Cited

U.S. PATENT DOCUMENTS

| | | | |
|---|---|---|---|
| 5,870,482 A | 2/1999 | Loeppert et al. | 381/174 |
| 7,888,840 B2 * | 2/2011 | Shimaoka et al. | 310/309 |
| 7,961,897 B2 | 6/2011 | Weigold | 381/174 |
| 2007/0003082 A1 | 1/2007 | Pedersen | 381/191 |
| 2008/0232615 A1 * | 9/2008 | Song et al. | 381/174 |
| 2009/0060232 A1 * | 3/2009 | Hirade et al. | 381/174 |
| 2010/0158280 A1 | 6/2010 | Coronato et al. | 381/174 |
| 2010/0254560 A1 | 10/2010 | Mehregany | 381/361 |
| 2012/0027235 A1 * | 2/2012 | Chan et al. | 381/174 |

OTHER PUBLICATIONS

Yang, "The Sensitivity Analysis of a MEMS Microphone with Different Membrane Diameters," Journal of Marine Science and Technology, vol. 18, No. 6, pp. 790-796, 2010.

International Searching Authority, International Search Report—International Application No. PCT/US2012/067906, dated Mar. 4, 2013, together with the Written Opinion of the International Searching Authority, 12 pages.

* cited by examiner

*Primary Examiner* — Ahmad F Matar
*Assistant Examiner* — Katherine Faley
(74) *Attorney, Agent, or Firm* — Maryam Imam; IPxLaw Group LLP

(57) ABSTRACT

A MEMS microphone has a stationary portion with a backplate having a plurality of apertures, and a diaphragm spaced from the backplate and having an outer periphery. As a condenser microphone, the diaphragm and backplate form a variable capacitor. The microphone also has a post extending between, and substantially permanently connected with, both the backplate and the diaphragm, and a set of springs securing the diaphragm to at least one of the post and the stationary portion. The post is positioned to be radially inward of the outer periphery of the diaphragm.

16 Claims, 8 Drawing Sheets

MEMS MICROPHONE WITH SPRINGS AND INTERIOR SUPPORT

FIELD OF THE INVENTION

The invention generally relates to MEMS devices and, more particularly, the invention relates to MEMS microphones

BACKGROUND OF THE INVENTION

MEMS condenser microphones typically have a diaphragm that forms a variable capacitor with an underlying backplate. Receipt of an audible signal causes the diaphragm to vibrate, consequently generating a variable capacitance signal representing the audible signal. It is this variable capacitance signal that can be amplified, recorded, or otherwise transmitted to another electronic device.

Undesirably, noise often degrades the noted variable capacitance signal. Those skilled in the art often respond to this problem by enlarging the diaphragm area, which should increase the variable capacitance signal. This solution, however, can create further problems. Specifically, stresses and long spans cause the central region of the diaphragm to droop toward the backplate, which creates another range of performance problems. For example, such a diaphragm may be more prone to sticking to the backplate.

SUMMARY OF VARIOUS EMBODIMENTS

In accordance with one embodiment of the invention, a MEMS microphone has a stationary portion with a backplate having a plurality of apertures, and a diaphragm spaced from the backplate and having an outer periphery. As a condenser microphone, the diaphragm and backplate form a variable capacitor. The microphone also has a post extending between, and substantially permanently connected with, both the backplate and the diaphragm, and a set of springs securing the diaphragm to at least one of the post and the stationary portion. The post is positioned to be radially inward of the outer periphery of the diaphragm.

The post may be spaced approximately equidistant between two different edges of the outer periphery of the diaphragm. For example, if the diaphragm has a center, then the post may extend substantially from the center of the diaphragm. Moreover, at least one of the set of springs may extend from the outer periphery of the diaphragm to the stationary portion. Alternatively, or in addition, at least one of the set of set of springs may extend from the post and to the diaphragm, e.g., the set of springs may secure the diaphragm to both the post and the stationary portion. The set of springs may include at least one elongated spring (e.g., in a serpentine shape) forming a space between the diaphragm and at least one of the post and the stationary portion.

Some embodiments have a plurality of additional posts extending between and contacting both the diaphragm and the backplate. The post(s) preferably is/are electrically isolated from one or both of the backplate and the diaphragm. The post and diaphragm combination applies to a number of differently sized diaphragms, such as those with a diameter of greater than about 1 millimeter.

In accordance with another embodiment, a MEMS microphone has a stationary portion with a backplate having a plurality of apertures, and a diaphragm, spaced from the backplate, having an outer periphery and a region radially inward of the outer periphery. As a condenser microphone, the diaphragm and backplate form a variable capacitor. The radially inward region of the diaphragm has a fixed area that is substantially unmovable relative to the stationary portion in response to an incident acoustic signal on the diaphragm. In addition, the radially inward region also has a movable area that is movable relative to the stationary portion in response to an incident acoustic signal. A set of springs secures the diaphragm to the stationary portion.

In accordance with other embodiments, a method of transducing an acoustic signal provides a MEMS microphone having a stationary portion with a backplate having a plurality of apertures, and a diaphragm spaced from the backplate and having an outer periphery. As a condenser microphone, the diaphragm and backplate form a variable capacitor. The microphone further has a post extending from and substantially permanently connected with the diaphragm. The post is positioned to be radially inward of the outer periphery of the diaphragm and normally biased to be spaced from the backplate. After providing this microphone, the method then energizes the variable capacitor to cause the diaphragm to move into contact with the backplate and remain in contact with the backplate while energized.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a MEMS microphone die has a diaphragm support post to substantially reduce diaphragm sagging. Accordingly, such embodiments can increase the diaphragm area, favorably increasing the signal to noise ratio. To ensure even finer resolution, such embodiments use springs to connect the diaphragm to 1) the support post, 2) a stationary portion of the microphone die, or 3) both the support post and stationary portion. Details of illustrative embodiments are discussed below.

Figure 1A:
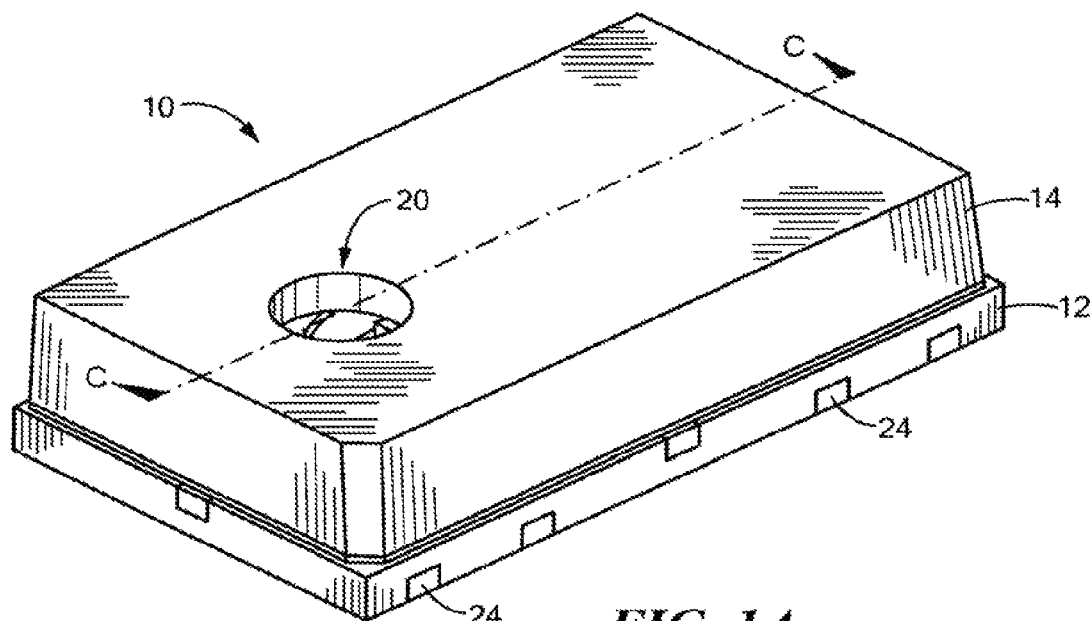
FIG. 1A schematically shows a top perspective view of a packaged microphone having a MEMS microphone die configured in accordance with illustrative embodiments of the invention.

FIG. 1A schematically shows a top, perspective view of a packaged microphone 10 that may incorporate a MEMS microphone die 16 (shown in FIGS. 1C, 1D, 2, and others discussed below) configured in accordance with illustrative embodiments of the invention. In a corresponding manner, FIG. 1B schematically shows a bottom, perspective view of the same packaged microphone 10.

The packaged microphone 10 shown in those figures has a package base 12 that, together with a corresponding lid 14, forms an interior chamber containing a microphone chip 16 and, if desired, a separate microphone circuit chip 18 (both dies 16 and 18 are shown schematically in FIGS. 1C and 1D and discussed below). The lid 14 in this embodiment is a cavity-type lid, which has four walls extending generally orthogonally from a top, interior face to form a cavity. In illustrative embodiments, the lid 14 is formed from metal or other conductive material to shield the microphone die 16 from electromagnetic interference. The lid 14 secures to the top face of the substantially flat package base 12 to form the interior chamber.

The lid 14 also has an audio input port 20 that enables ingress of audio signals into the chamber. In alternative embodiments, however, the audio port 20 is at another location, such as through the package base 12, or through one of the side walls of the lid 14. Audio signals entering the interior chamber interact with the microphone chip 16 to produce an electrical signal that, with additional (exterior) components (e.g., a speaker and accompanying circuitry), produce an output audible signal corresponding to the input audible signal.

Figure 1B:
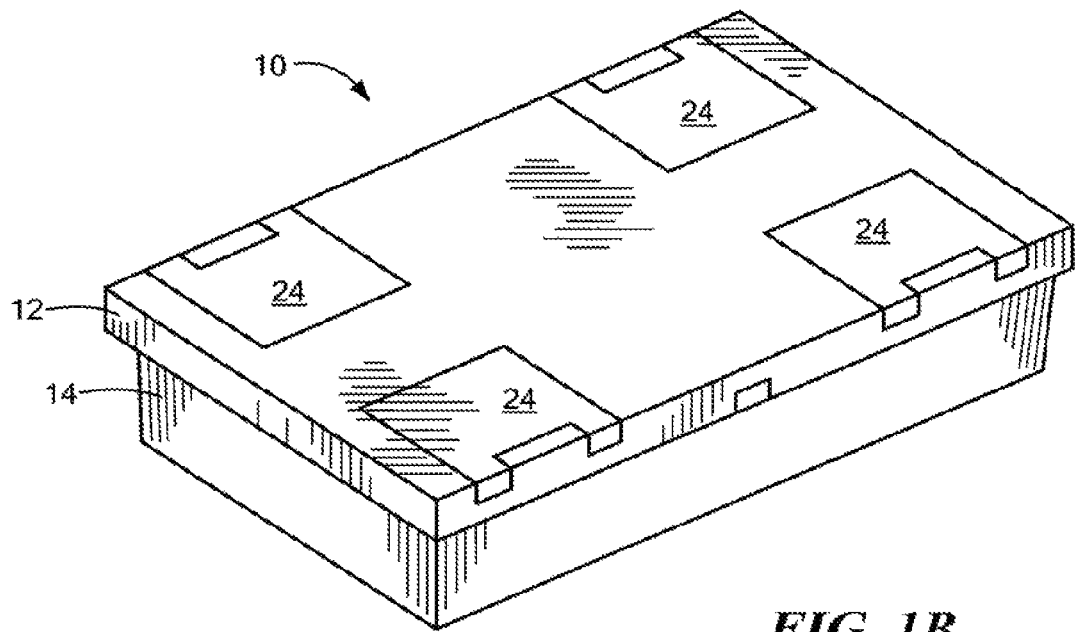
FIG. 1B schematically shows a bottom perspective view of the packaged microphone shown in FIG. 1A.

FIG. 1B shows the bottom face 22 of the package base 12, which has a number of contacts 24 for electrically (and physically, in many anticipated uses) connecting the microphone die 16 with a substrate, such as a printed circuit board or other electrical interconnect apparatus. The packaged microphone 10 may be used in any of a wide variety of applications. For example, the packaged microphone 10 may be used with mobile telephones, land-line telephones, computer devices, video games, hearing aids, hearing instruments, biometric security systems, two-way radios, public announcement systems, and other devices that transduce signals. In fact, it is anticipated that the packaged microphone 10 could be used as a speaker to produce audible signals from electronic signals.

In illustrative embodiments, the package base 12 shown in FIGS. 1A and 1B may be a printed circuit board material, such as FR-4, or a premolded, leadframe-type package (also referred to as a "premolded package"). Other embodiments may use different package types, such as ceramic cavity packages. Accordingly, discussion of a specific type of package is for illustrative purposes only.

Figure 1C:
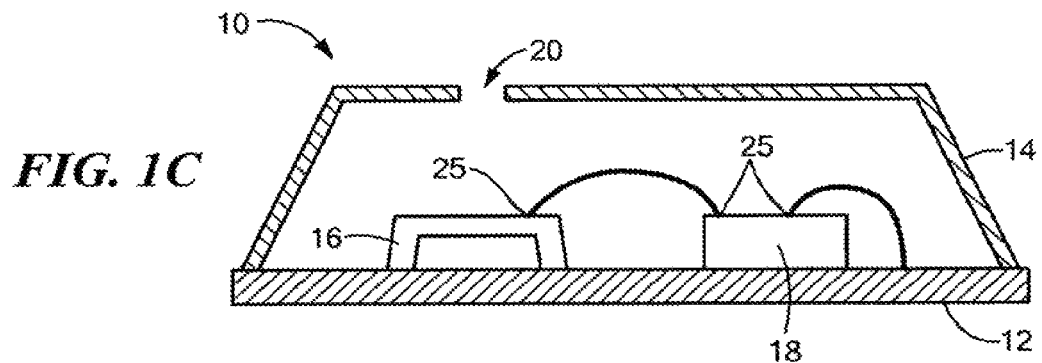
FIG. 1C schematically shows a cross-sectional view of the packaged microphone oriented as shown in FIG. 1A.
Figure 1D:
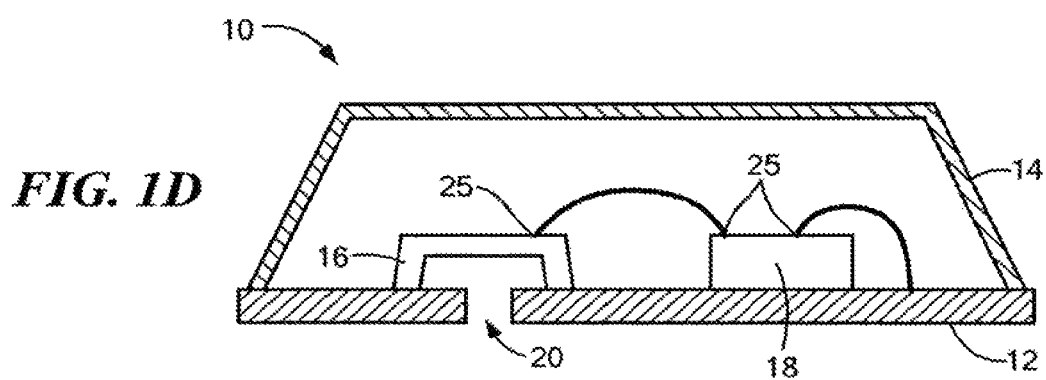
FIG. 1D schematically shows a cross-sectional view of a similar packaged microphone having a bottom port.

FIG. 1C schematically shows a cross-sectional view of the packaged microphone 10 across line C-C of FIG. 1A. As shown and noted above, the lid 14 and base 12 form the noted internal chamber for containing a MEMS microphone die 16 and electronics 18 used to control and drive the microphone die 16. In illustrative embodiments, electronics are implemented as a second, stand-alone integrated circuit, such as an application specific integrated circuit ("ASIC 18"). Other embodiments, however, may form the MEMS microstructure and electronic circuitry on a single die.

Adhesive or another fastening mechanism secures both the microphone die 16 and ASIC die 18 to the base 12. Wirebonds electrically connect the microphone die 16 and ASIC die 18 to contact pads (not shown) on the interior of the package base 12.

While FIGS. 1A-1C show a top port packaged microphone design, some embodiments position the input port at other locations, such as through the base 12. For example, FIG. 1D schematically shows a cross-sectional view of a similar packaged microphone 10 where the microphone die 16 covers the input port, consequently producing a large back volume. Other embodiments, not shown, position the microphone die 16 so that it does not cover the input port 20 through the base 12.

Discussion of a specific packaged microphone is for illustrative purposes only. Accordingly, the packaged microphone 10 discussed with regard to FIGS. 1A-1D are not intended to limit all embodiments of the invention.

Figure 2:
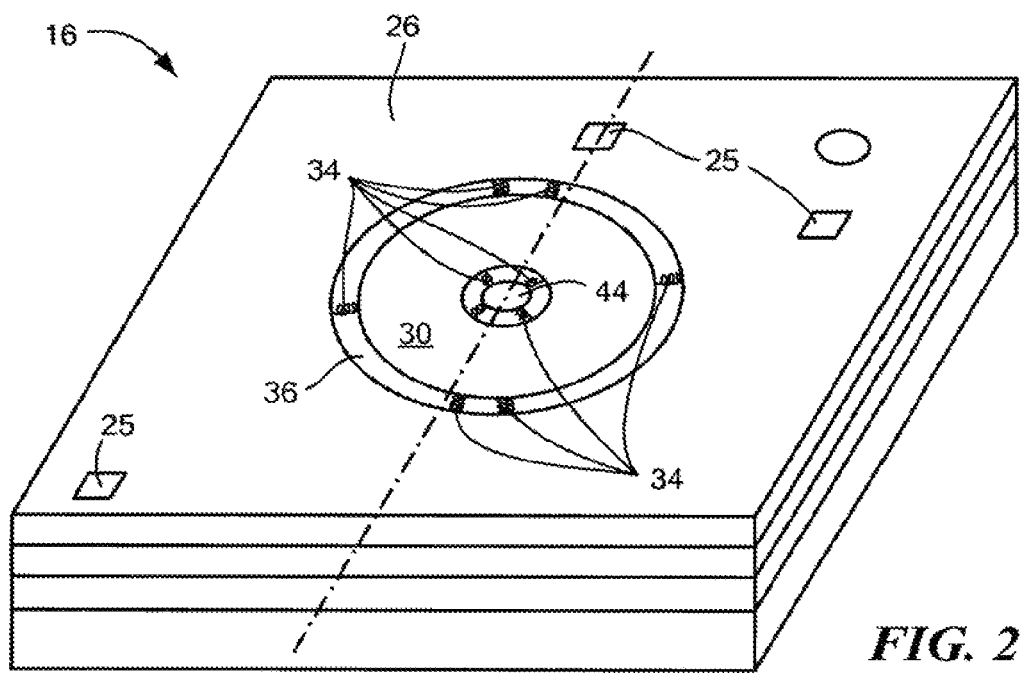
FIG. 2 schematically shows a MEMS microphone die generally configured in accordance with illustrative embodiments of the invention.

FIG. 2 schematically shows a top, perspective view of the MEMS microphone die 16 (also referred to as a "microphone chip 16") that may be fabricated in accordance with illustrative embodiments of the invention. Subsequent FIGS. 3A-6 show top and cross-sectional views 18 across line 2-2 of FIG. 2 of the same microphone die 16 in various different embodiments.

Among other things, the microphone die 16 includes a stationary portion 26 that supports and forms a variable capacitor 28 with a flexible diaphragm 30.

In illustrative embodiments, the stationary portion 26 includes a backplate 32 (shown in subsequent figures and discussed below) formed from single crystal silicon (e.g., the top layer of a silicon-on-insulator wafer, discussed below) and other deposited layers, while the diaphragm 30 is formed from a deposited material only, such as deposited polysilicon. Other embodiments, however, use other types of materials to form the stationary portion 26 and the diaphragm 30. For example, a single crystal silicon bulk wafer, and/or some deposited material, may form the stationary portion 26. In a similar manner, a single crystal silicon bulk wafer, part of an silicon-on-insulator wafer, or some other deposited material may form the diaphragm 30.

Springs 34 movably and integrally connect the outer periphery of the diaphragm 30 to the stationary portion 26 of the microphone die 16. The springs 34 effectively form a plurality of apertures 36 that permit at least a portion of the audio/acoustic signal to pass through the diaphragm 30. These apertures 36, which also may be referred to as "diaphragm apertures 36," may be any shape as required by the application, such as in the shape of a slot, round hole, or some irregular shape. Electrical contacts 25 on the top face of the dies 16 and 18 provide electrical connection for the wirebonds shown in FIGS. 1C and 1D.

Figure 3A:
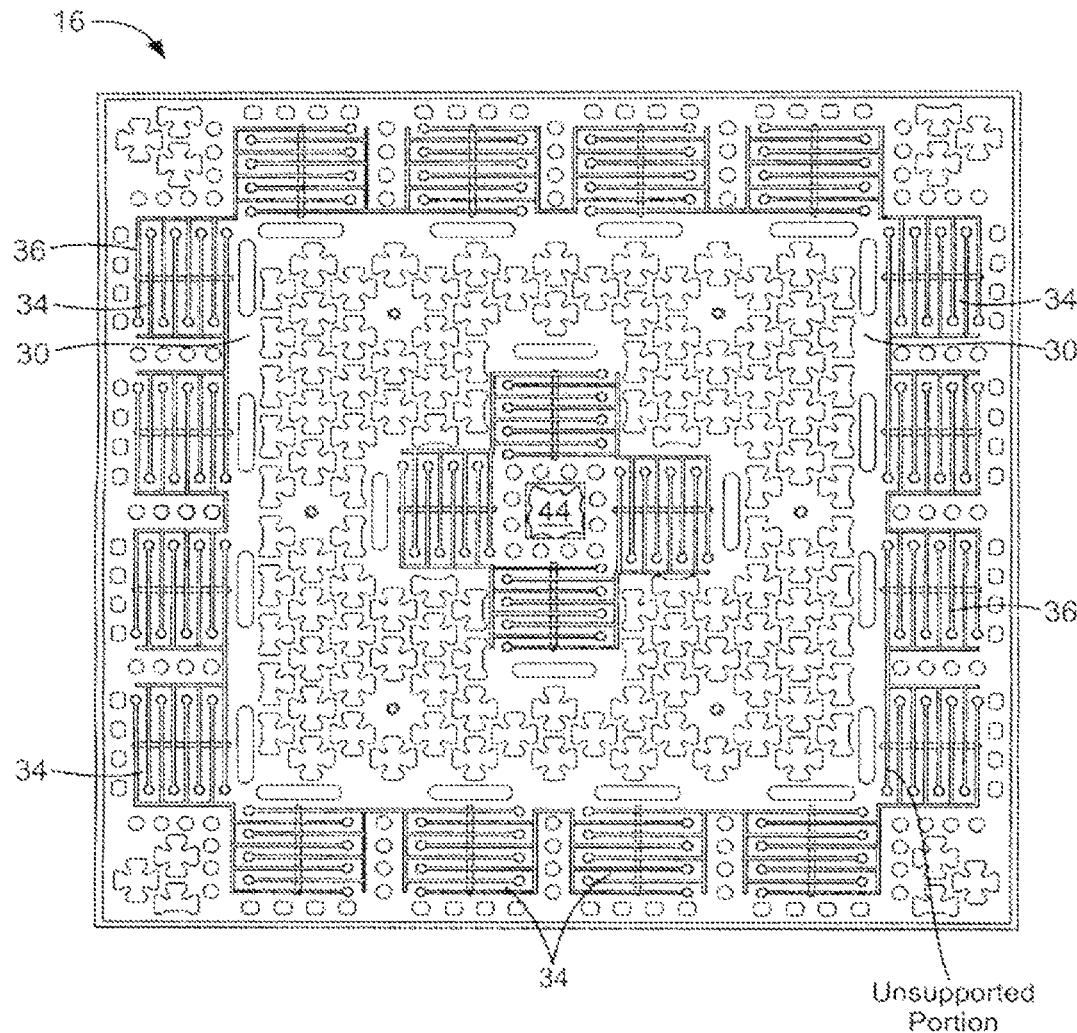
FIG. 3A schematically shows a top view of a MEMS microphone configured with a post and springs coupling to the post and diaphragm in accordance with one embodiment of the invention.
Figure 3B:
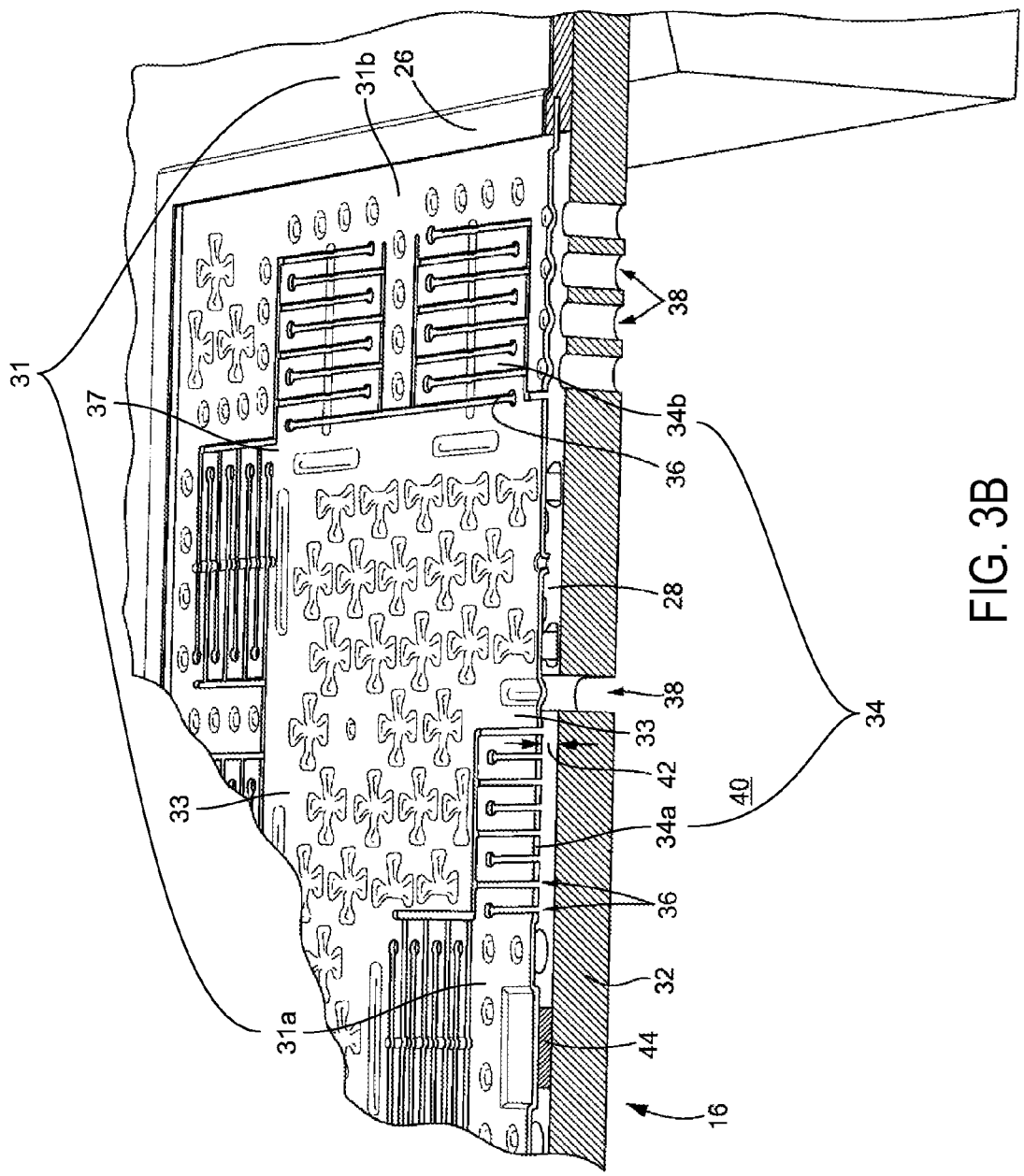
FIG. 3B schematically shows a cross-sectional perspective view of the MEMS microphone shown in FIG. 3A.

FIGS. 3A and 3B show more details of this embodiment of the MEMS microphone die 16, but with a generally rectangular diaphragm 30. In particular, FIG. 3A to schematically shows more detail of a top view of the microphone die 16 shown in FIG. 2. FIG. 3B schematically shows a cross-sectional view of that same microphone die 16.

As shown best in FIG. 3B, the stationary portion 26 of the microphone die 16 has a backplate 32 that, together with the diaphragm 30, forms a variable capacitor 28. As known by those skilled in the art, the variable capacitor 28 produces electrical signals representing input acoustic signals incident on the diaphragm 30. To facilitate operation, the backplate 32 has a plurality of through-hole apertures ("backplate apertures 38") that lead to a backside cavity 40. The apertures 38 may be shaped, sized, and configured to optimize performance. One such configuration has both generally round holes and slots (i.e., elongated holes), while another configuration has only generally round holes arranged in a specific pattern.

When at rest, whether energized or not, many prior art diaphragms deform to some extent (e.g., they may sag, among other things) due to inherent stresses and the forces of gravity. Portions of some prior art diaphragms may sag between 25 and 50 percent of the "nominal distance/gap 42" between it and the backplate 32. More specifically, this "nominal distance/ gap 42" is considered to be the distance between the diaphragm 30 and the backplate 32, at rest, if the diaphragm 30 were perfectly flat. For example, some portions of the diaphragm 30 may be spaced about 3 microns from the backplate 32, while more central regions of the diaphragm 30 may be spaced about two microns from the backplate 32.

Sagging increases the likelihood that the diaphragm 30 will contact the backplate 32, which can cause a multitude of problems. For example, the diaphragm 30 may stick to the backplate 32 (known in the art as "stiction"), which can destroy the device, or cause a short circuit between the diaphragm 30 and the backplate 32. Even if those noted problems do not occur, contact between the diaphragm 30 and back plate often reduces the quality of the output signal by distorting the signal peaks (e.g., flattening the signal peaks), among other things.

Diaphragm sag may not be a concern in some microphone designs that have very small diaphragms (e.g., longest dimensions parallel with the X-Y plane of FIG. 3A of less than about 1 millimeter). The inventors realized, however, that smaller microphones often have a lower signal to noise ratio than those with larger diaphragms. A larger diaphragm thus often is desirable to improve microphone performance. For example, diaphragms having maximum dimensions of greater than 1 millimeter should provide improved signal to noise ratios if sag can be controlled.

Accordingly, to control diaphragm sag, illustrative embodiments of the invention, as shown in FIGS. 2, 3A, and 3B, have at least one supporting post 44 supporting an interior portion of the diaphragm 30. In other words, the supporting post 44 effectively immobilizes a portion of the diaphragm 30, causing it to be substantially stationary. This often is near the general center or centroid of the diaphragm 30. For example, the post 44 may be positioned substantially equidistant between two opposing edges of a diaphragm 30. Although various embodiments are believed to produce improved results with larger diaphragms (i.e., larger than about 1 millimeter), various embodiments also apply to smaller diaphragms.

As noted above, springs 34 support the periphery of the diaphragm 30 by coupling with the stationary portion 26. Those springs 34 shown in FIG. 3A and FIG. 3B form the above noted spring aperture or space 36. Accordingly, some portion of the periphery of the diaphragm 30 is not directly connected with the stationary portion 26. FIG. 3A calls out one portion of the periphery with the words "unsupported portion." In any event, many points around the diaphragm periphery are supported. Thus, despite the fact that there is some portion of the periphery that is suspended, this arrangement is not considered to be a cantilevered configuration.

For example, the diaphragm periphery may have areas that connect with a spring 34 at least every 180 degrees or less (i.e., opposing springs 34 on each side of the diaphragm 30). Other embodiments may have springs 34 that are spaced apart about 120 degrees or less, about 90 degrees or less, about 60 degrees or less, about 45 degrees or less, etc. . . .

The rectangularly shaped diaphragm 30 shown in FIG. 3A has 16 springs 34 substantially equidistantly spaced around the diaphragm periphery. As a rectangular diaphragm 30, these 16 springs 34 are not necessarily precisely and equally spaced around the diaphragm 30 as they would be if the diaphragm 30 were round. Instead, they are positioned so that they have at least two opposed springs 34 (i.e., about 180 degrees apart), and others therebetween. Thus, this rectangularly shaped diaphragm 30 may be considered to have springs 34 spaced about 180 degrees apart and less. Another way of viewing this diaphragm 30 is that it has a plurality of straight sides, and each side has at least one spring. Accordingly, if the diaphragm 30 were another polygon-type shape, such as an octagon, pentagon, etc. . . . , then it would have at least one spring 34 on each side and thus, not be cantilevered. Each side can have the same number, type and spacing of springs 34, or a different number, type and spacing of springs 34. If the diaphragm 30 is irregularly shaped, then it is anticipated that at least having springs 34 180 degrees apart would provide satisfactory results.

The springs 34 around the diaphragm periphery in FIGS. 3A and 3B are elongated and formed in a serpentine manner. As known by those in the art, serpentine springs 34 can provide more control of the diaphragm 30 than direct, straight stubby springs 34. Of course, other types of springs 34 should suffice, such as a spring 34 that merely is a solid connection to the stationary portion 26 (i.e., like a drum). Such type of spring 34 is thinner to permit more diaphragm flexibility and designed to permit a more piston-like depression of the diaphragm 30 (see below). In addition, although the microphone die 16 of FIG. 3A has symmetrically positioned springs 34, alternative embodiments may have springs 34 that are not symmetrically positioned.

This is in contrast to some prior art designs, which may secure to a supporting post 44 only, or one side of the stationary portion 26. Specifically, rather than connect the diaphragm periphery at all, some prior art designs actually permit the outer periphery of the diaphragm 30 to hang in a cantilevered fashion. The inventors realized that such a prior art design is less controllable and often produces poor results. Illustrative embodiments should more controllably move toward and away from the backplate 32, in the Z-direction, in a more planar, piston-like manner than the noted prior art designs.

To that end, springs 34 also may couple between the supporting post 44 and inner periphery of the diaphragm 30 to further improve performance. Those springs 34 may be any of the types discussed above, and also have unsupported areas that create spaces 36 between the post 44 and the diaphragm 30 or spring 34, whichever is the case. Like the outer periphery springs (also known as "outer springs") 34*b*, shown in FIG. 3B, these inner springs 34*a*, also shown in FIG. 3B, may be positioned 180 degrees or less around the supporting post 44 (e.g., 120 degrees or less, 90 degrees or less, as shown in FIG. 3A, etc. . . ), or in the other manners discussed above with regard to the outer springs 34 (e.g., one on each side of the post 44 having a cross-section with a polygon shape). Other embodiments do not use springs between the post 44 and diaphragm 30 (discussed below). The outer springs 34*b* and 34*a* collectively define the springs 34, as shown in FIG. 3B.

As suggested above, the post 44 may take on any of a number of forms, shapes, and dimensions. For example, the post 44 may have a generally rectangular, rounded, or irregular cross sectional shape. In illustrative embodiments, the post 44 is formed from polysilicon, integrally extending from the diaphragm 30 and integrally connected with the backplate 32. Such a connection may be considered one type of permanent connection (i.e., absent unusual forces, such as using a saw, the components will remain connected). Unlike certain prior art non-MEMS microphones, the post 44 does not conduct current to or from the diaphragm 30. Instead, the post 44 essentially is an electrical dead end. Accordingly, the post 44 does not electrically connect the diaphragm 30 and the backplate 32 because if it did, the two plates of the variable capacitor 28 (i.e., the backplate 32 and diaphragm 30) would be the same potential, causing the capacitor not to work. To that end, the post 44 preferably has some insulating material between it and one or both of the diaphragm 30 and the backplate 32. For example, during fabrication, before depositing the diaphragm layer, processes may form an insulating oxide layer (e.g., a native oxide) on the top side of the post 44 (i.e., the side of the post 44 that ultimately connects with the diaphragm 30). Subsequent fabrication steps thus may deposit a polysilicon diaphragm layer over that oxide. The oxide layer between the top of the post 44 and the diaphragm 30 thus prevents electrical communication between the diaphragm 30 and backplate 32 via the post 44.

Of course, the MEMS microphone die 16 may have other means for electrically isolating the post 44 from one or both of the diaphragm 30 and the backplate 32. Another technique may form an oxide or insulating layer between the bottom of the post 44 in the backplate 32. Other embodiments may form an electrically insulating trench around the post 44 around the region where it connects to either or both the diaphragm 30 and the backplate 32. Other embodiments may simply form the post 44 with a nonconductive material, such as undoped silicon, oxide, nitride, or some combination of conductive and non-conductive materials commonly used in MEMS fabrication processes.

Figure 4A:
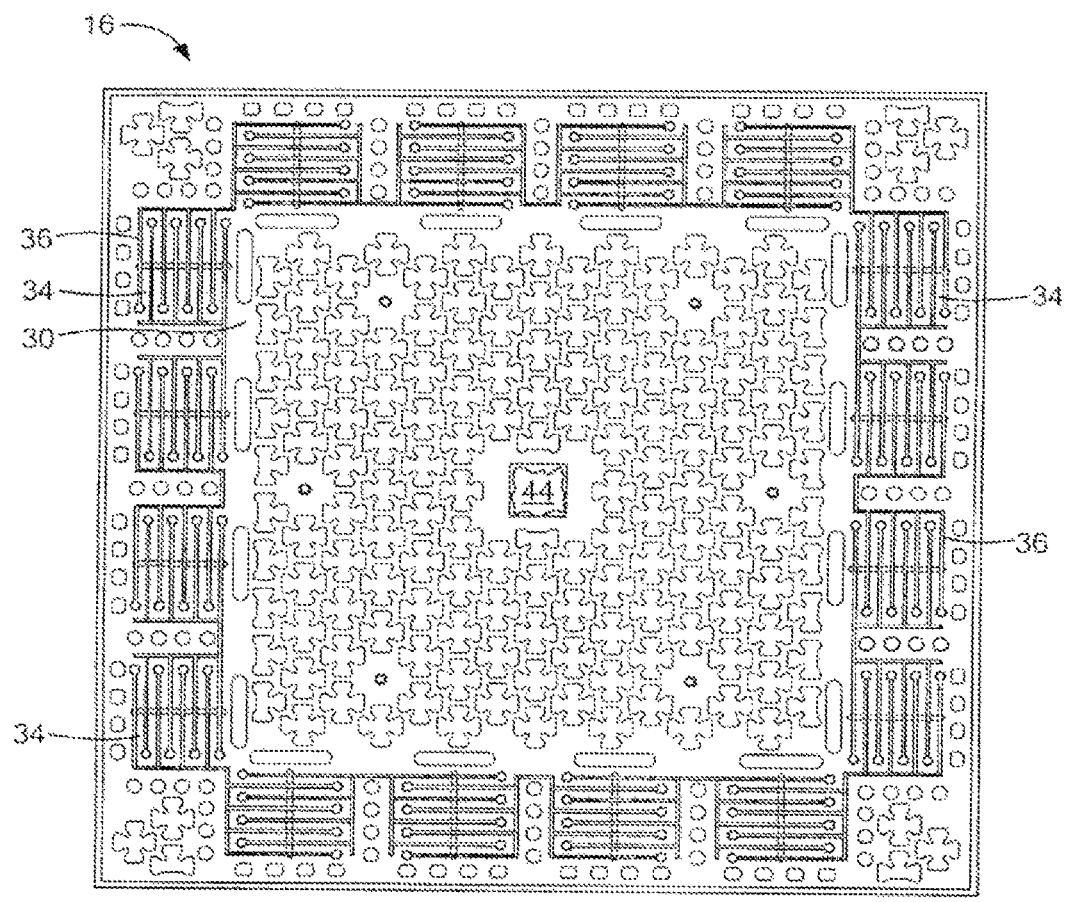
FIG. 4A schematically shows a top view of a MEMS microphone in accordance with another embodiment of the invention.
Figure 4B:
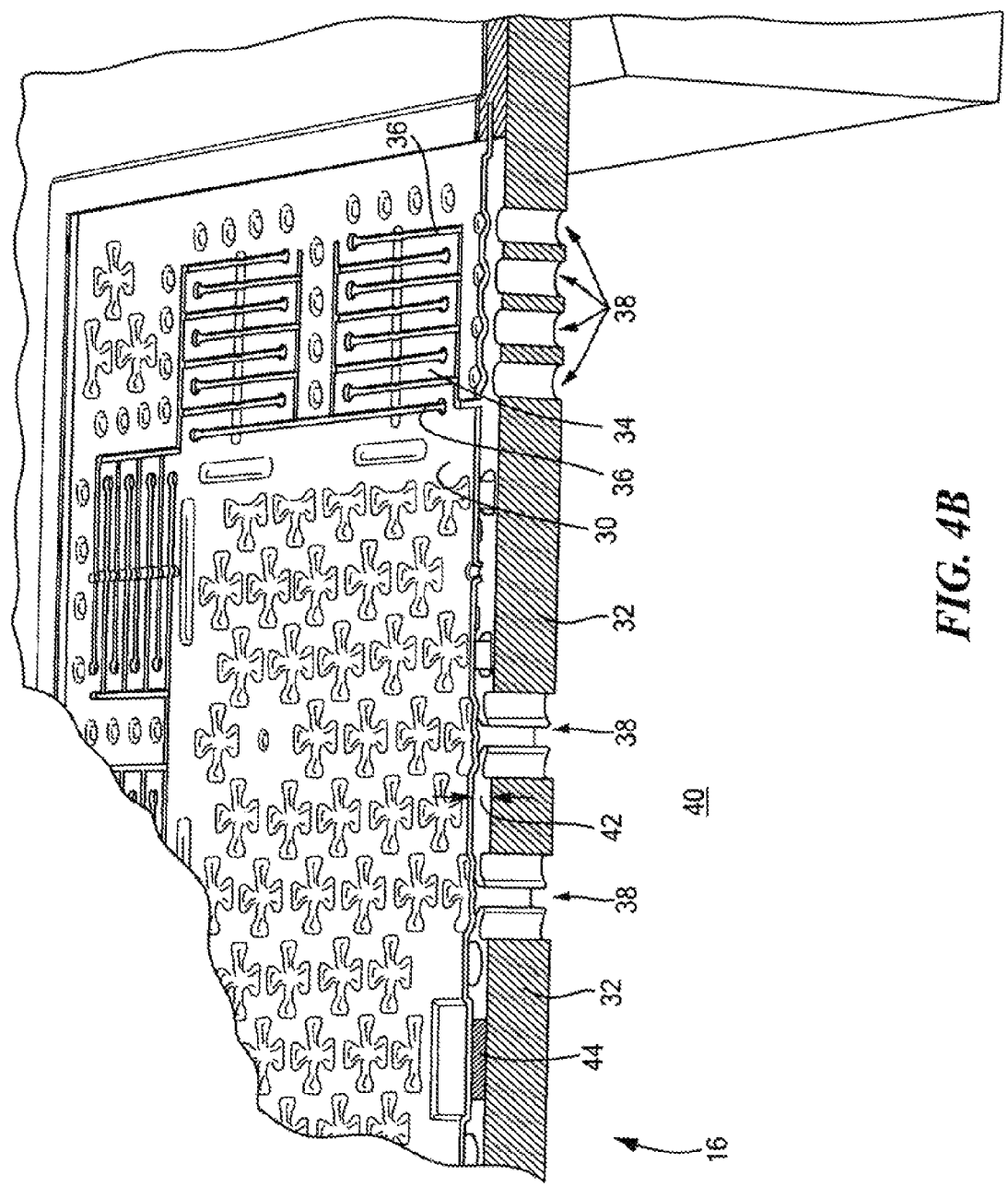
FIG. 4B schematically shows a cross-sectional perspective view of the MEMS microphone shown in FIG. 4A.

While FIGS. 3A and 3B show springs 34 both along the inner periphery and outer periphery 37 of the diaphragm 30, other embodiments may omit springs 34 from one or both of those regions. FIGS. 4A and 4B schematically show one embodiment, the former in a plan view, and the latter in a cross-sectional perspective view. This embodiment retains the springs 34 along the outer periphery, and eliminates the springs 34 between the post 44 and the diaphragm 30. Other embodiments may have springs 34 along the inner diaphragm periphery only, or no springs 34 along either the inner or outer diaphragm periphery. FIG. 4B incidentally show depressions (each having three or four portions protruding from a generally central point) on the diaphragm 30 corresponding to the apertures 38 through the back plate 32.

As previously discussed, a portion of the diaphragm 30 that is integrally connected with the post 44, i.e. fixed area 31A remains substantially stationary. A moveable area 33 of the diaphragm 30 does not directly contact the post 44 and is the area between the springs 34B and the post 44, as shown in FIG. 3B. The fixed area 31 comprises an outer fixed area 31b and an inner fixed area 31a, as shown in FIG. 3B.

Using the post 44 or other means to cause the general central region of the diaphragm 30 to remain substantially stationary as a number beneficial effects. Specifically, it significantly shortens the length/ span of the diaphragm 30. As an example, consider a circularly shaped diaphragm with a one millimeter diameter that normally sags, approximately at its center, about 1 micron across a nominal three micron gap 42 (i.e., if perfectly planar, the gap 42 between the diaphragm 30 and the backplate 32 would be three microns). Positioning a post 44 about at the center of the diaphragm 30 should reduce diaphragm sag by about 50 percent. Accordingly, the remaining movable portions of the diaphragm 30 (i.e., the portions not held substantially stationary by the post 44) should sag no more than about 0.5 microns.

The inventors realized that this reduction in diaphragm sag enables them to enlarge the diaphragm 30, thus increasing the signal produced by the variable capacitor 28. Accordingly, continuing with the above example, the diaphragm 30 now may have a diaphragm 30 that is twice the size; namely, having a diameter of about 2 millimeters. The diaphragm 30 sag again, however, is expected to be about one micron, at worst. However, since the area increases with the square of the radius, this produces a four-fold increase in surface area and thus, a corresponding four-fold signal-to-noise ratio boost.

It should be noted that the area taken up by the post 44 does degrade the improved signal to some extent. Contrary to this intuitive suggestion to avoid a post to maximize surface area of the variable capacitor 28, however, the inventors realized that the significantly improved signal substantially overrides this degradation by the post. In other words, the post 44 produces no more than an insignificant reduction or degradation in the signal quality. In addition, noise produced by the variable capacitor 28 does not increase at a rate corresponding with the increase in signal. This provides the favorable result of substantially improving the signal to noise ratio of the microphones die 16.

The inventors discovered that the supporting post 44 provides a number of additional benefits. Specifically, those skilled in the art know that the ASIC die 16 has an input capacitance that reduces the net signal produced by the packaged microphone 10. The substantially increased microphone die capacitance thus minimizes or reduces the negative impact of this input ASIC capacitance, and other parasitic capacitances in the system. In addition, the larger microphone die capacitance reduces noise by moving its effective low-frequency cut off.

During use, an incident acoustic signal causes the diaphragm 30 to move generally along the Z-axis. Ideally, the diaphragm 30 moves along the Z-axis as a plunger-- nearly all of its points move upwardly and downwardly at the same rate. The springs 34 are configured to ensure that the diaphragm 30 moves in the intended manner upon receipt of signals having specified amplitudes. For example, certain microphone dies may be produced for low amplitude acoustic signals (e.g., signals that are not considered very loud) and thus, have springs 34 with relatively low spring constants. Such springs 34 may be thinner, longer, or made in a manner that permits such behavior. Indeed, a very high amplitude signal striking such a microphone could damage the springs 34 and diaphragm 30.

Figure 5:
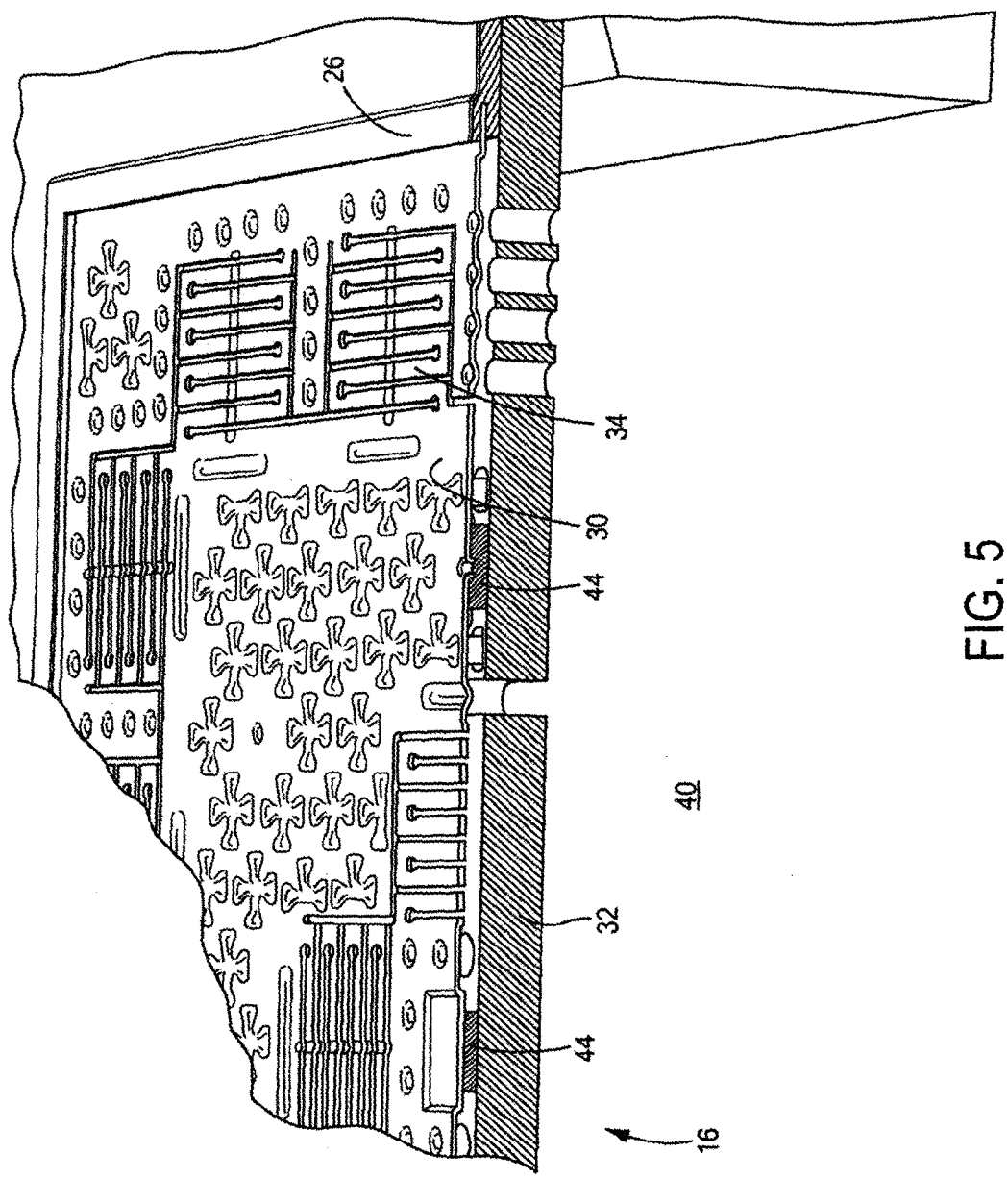
FIG. 5 schematically shows a cross-sectional perspective view of a MEMS microphone having multiple posts between the diaphragm and backplate.

Although discussed as being generally near or at the general centroid or center of the diaphragm 30, some embodiments (as noted above) may offset the post 44 to other locations relative to the diaphragm 30. FIG. 5 schematically shows another embodiment in which the microphone die 16 has a plurality of posts 44. These posts 44 may be strategically positioned depending upon the anticipated use and application of the microphone chip 16. Those skilled in the art can select the appropriate locations based upon anticipated use.

Figure 6A:
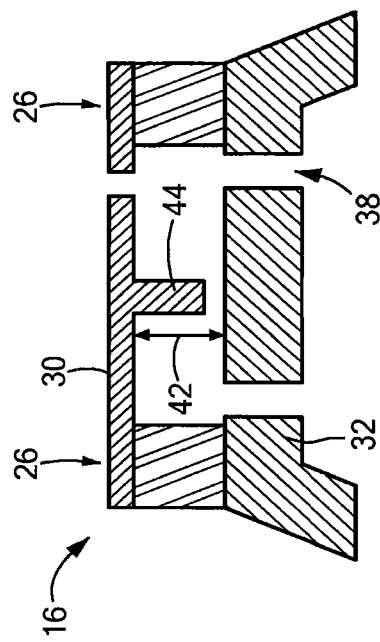
FIGS. 6A and 6B schematically show a cross-sectional view of a MEMS microphone die configured in accordance with yet another embodiment of the invention.
Figure 6B:
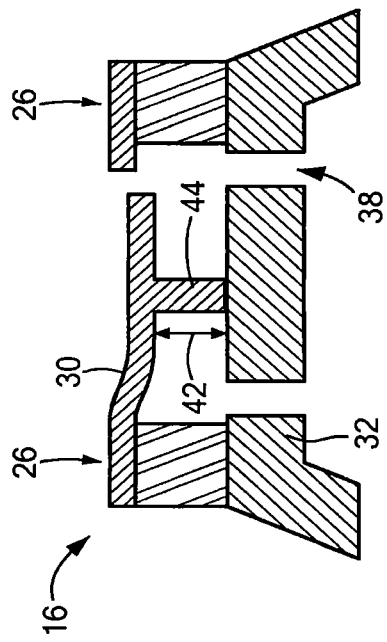

Other embodiments have a movable post 44 between the diaphragm 30 and the backplate 32. FIGS. 6A and 6B show one such embodiment, in which the post 44 integrally extends that relief from the diaphragm 30. As shown in FIG. 6A, the un-energized position, the diaphragm 30 is normally biased so that the post 44 does not contact the backplate 32—i.e., when the microphone chip 16 is not energized. The post 44 may extend substantially the entire length of the diaphragm 30/backplate 32 gap 42 and leave only a small space for it to travel upon receipt of a voltage. For example, when used in a microphone chip 16 having a nominal 3 micron gap 42 between the diaphragm 30 and the backplate 32, the post 44 may extend so that it is only about 0.1 or 0.2 microns from the backplate 32 when unenergized. This distance also takes nominal, unenergized sag into account. Other embodiments may permit the post 44 to span the entire diaphragm 30/backplate 32 gap 42 even when not energized.

It should be noted that this cross-sectional view of FIG. 6A is across a spring 34 on the left side of the diaphragm 30 (from the perspective of figure) and an open space 36 on the right side of the diaphragm 30. In other words, the spring structure around this embodiment can be similar to any of those described above with regard to other embodiments.

Application of an electrostatic force (e.g., a force resulting from a voltage difference) between the diaphragm 30 and backplate 32 of FIG. 6A forces the diaphragm 30 downwardly until the post 44 contacts the backplate 32 (FIG. 6B). At this point, the microphone die 16 is ready to receive and transduce input acoustic signals.

Rather than extending from the diaphragm 30, alternative embodiments of the microphone chip 16 shown in FIGS. 6A and 6B extend the post 44 upwardly from the backplate 32. This is somewhat less desirable than the embodiment shown in FIGS. 6A and 6B because the diaphragm 30 often as much thinner than the backplate 32 and thus, may become damaged and brought down with too much force onto the top of the post 44.

Figure 7:
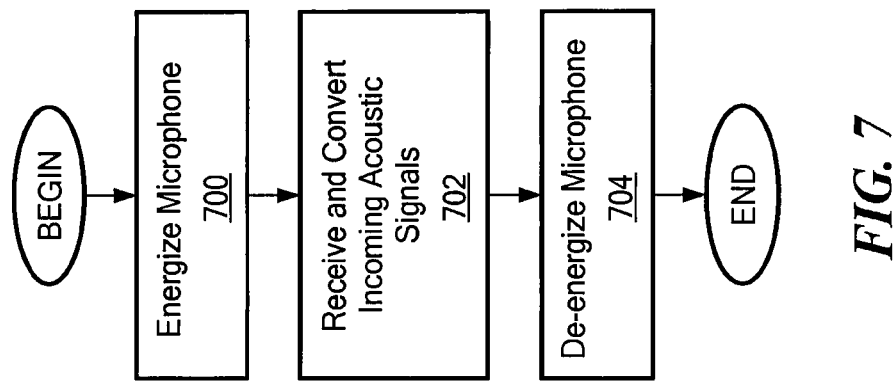
FIG. 7 shows a process of using the MEMS microphone shown in FIGS. 6A and 6B.

FIG. 7 shows a simplified process of using a MEMS microphone chip 16 shown in FIGS. 6A and 6B. The process begins at step 700, which energizes the microphone die 16. This causes the diaphragm 30 and post 44 to move downwardly to contact the backplate 32 (FIG. 6B). While energized, the portion of the diaphragm 30, i.e. fixed area 31 shown in FIG. 3B, that is integrally connected with the post 44 should remain substantially stationary.

At this point, the MEMS microphone die 16 receives and converts incoming acoustic signals in normal course (step 702). Finally, the process concludes at step 704 by de-energizing the microphone die 16. The resiliency of the springs 34 and diaphragm 30 thus cause the diaphragm 30 and post 44 to return to the rest position as shown in FIG. 6A.

Although the above discussion discloses various exemplary embodiments of the invention, it should be apparent that those skilled in the art can make various modifications that will achieve some of the advantages of the invention without departing from the true scope of the invention.

What is claimed is:

1. A MEMS microphone comprising:
a backplate having a plurality of apertures;
a diaphragm spaced from the backplate and having an outer periphery, the diaphragm and backplate forming a variable capacitor;
a post disposed between the diaphragm and the backplate by physically extending from the diaphragm and permanently connecting to the backplate, the post being near a general centroid of the diaphragm and positioned substantially equidistant between two opposing edges of the diaphragm;
a first set of springs securing the post to the diaphragm; and
a second set of springs securing the outer periphery to a fixed area, the fixed area being unmovable relative to the backplate.

2. The MEMS microphone as defined by claim 1, wherein the post extends from the centroid of the diaphragm.

3. The MEMS microphone as defined by claim 1, wherein the first set of springs extends from the post to the diaphragm.

4. The MEMS microphone as defined by claim 1, wherein the first set of springs includes at least one elongated spring forming a space between the diaphragm and the post.

5. The MEMS microphone as defined by claim 1, further comprising a plurality of additional posts extending between and contacting both the diaphragm and the backplate.

6. The MEMS microphone as defined by claim 1, wherein the post is electrically isolated from one or both of the backplate and the diaphragm.

7. The MEMS microphone as defined by claim 1, wherein the diaphragm has a diameter of greater than about 1 millimeter.

8. The MEMS microphone as defined by claim 1, wherein the second set of springs includes at least one elongated spring.

9. A MEMS microphone comprising:
a backplate having a plurality of apertures;
a diaphragm spaced from the backplate and having an outer periphery, the diaphragm and backplate forming a variable capacitor,
a fixed area being unmovable relative to the backplate in response to an incident acoustic signal on the diaphragm when the variable capacitor is energized,
a movable area being movable relative to the backplate in response to an incident acoustic signal;
a post disposed between the diaphragm and the backplate by physically extending from the diaphragm and permanently connecting to the backplate, near a general centroid of the diaphragm and positioned substantially equidistant between two opposing edges of the diaphragm;
a first set of springs securing the post to the diaphragm; and
a second set of springs securing the outer periphery to the fixed area.

10. The MEMS microphone as defined by claim 9, wherein the first set springs is elongated.

11. The MEMS microphone as defined by claim 9, wherein the post is electrically isolated from the diaphragm.

12. The MEMS microphone as defined by claim 9, wherein the first set of springs includes at least one elongated spring forming a space between the diaphragm and the post.

13. The MEMS microphone as defined by claim 9, wherein the second set of springs includes at least one elongated spring.

14. A method of transducing an acoustic signal, the method comprising:
providing a MEMS microphone comprising a backplate having a plurality of apertures, a diaphragm spaced from the backplate and having an outer periphery, the diaphragm and backplate forming a variable capacitor; and
a post disposed between the diaphragm and the backplate by physically extending from the diaphragm and permanently connecting to the diaphragm, the post being normally biased to be spaced from the backplate and positioned near a general centroid of the diaphragm and positioned substantially equidistant between two opposing edges of the diaphragm; and
energizing the variable capacitor to cause the post to move into contact with the backplate and remain in contact with the backplate while energized,
wherein a first set of springs secures the post to the diaphragm and a second set of springs secures the outer periphery to a fixed area, the fixed area being unmoveable relative to the backplate.

15. The method as defined by claim 14, further comprising:
receiving an acoustic signal on the diaphragm to cause the diaphragm to move relative to the backplate, the variable capacitor generating a signal representative of the acoustic signal, the post remaining in contact with the backplate while the variable capacitor generates the signal.

16. The method as defined by claim 15, further comprising: de-energizing the variable capacitor to cause the post to return to its biased position spaced from the backplate.

* * * * *